(12) United States Patent
Cho

(10) Patent No.: US 8,759,936 B2
(45) Date of Patent: Jun. 24, 2014

(54) ELECTRONIC DEVICES AND THERMAL IMAGE SENSORS THAT UTILIZE EMBEDDED QUANTUM DOTS

(75) Inventor: Choong Rae Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 379 days.

(21) Appl. No.: 13/051,199

(22) Filed: Mar. 18, 2011

(65) Prior Publication Data
US 2011/0227041 A1    Sep. 22, 2011

(30) Foreign Application Priority Data
Mar. 18, 2010  (KR) .................. 10-2010-0024412

(51) Int. Cl.
*H01L 31/00* (2006.01)

(52) U.S. Cl.
USPC ............ 257/467; 257/431; 257/441; 257/442

(58) Field of Classification Search
USPC .................. 257/E27.144, E29.071, E31.033, 257/E31.067, E31.093, 431, 441, 442, 467; 374/1–210
See application file for complete search history.

(56) References Cited

U.S. PATENT DOCUMENTS

| | | | |
|---|---|---|---|
| 6,495,829 B1 * | 12/2002 | Oda | ................. 250/339.02 |
| 6,778,316 B2 | 8/2004 | Halas et al. | |
| 2005/0064618 A1 | 3/2005 | Brown et al. | |

FOREIGN PATENT DOCUMENTS

| | | | |
|---|---|---|---|
| EP | 1912260 A1 * | 4/2008 | |
| KR | 1020000033998 A | 6/2000 | |

\* cited by examiner

*Primary Examiner* — Matthew W Such
*Assistant Examiner* — David Spalla
(74) *Attorney, Agent, or Firm* — Myers Bigel Sibley & Sajovec, P.A.

(57) ABSTRACT

Integrated circuit devices include thermal image sensors that utilize quantum dots therein to provide negative resistance characteristics to at least portions of the sensors. The thermal image sensor may include a sensing unit configured to absorb radiation incident on a first surface thereof and first and second electrodes electrically coupled to the sensing unit. The sensing unit includes a plurality of quantum dots therein, which may extend between the first and second electrodes. These quantum dots may be configured to impart a negative resistance characteristic to the sensing unit. In particular, the sensing unit may include a sensing layer having first and second opposing ends, which are electrically coupled to the first and second electrodes, respectively, and the plurality of quantum dots may be distributed within the sensing layer.

19 Claims, 13 Drawing Sheets

ELECTRONIC DEVICES AND THERMAL IMAGE SENSORS THAT UTILIZE EMBEDDED QUANTUM DOTS

REFERENCE TO PRIORITY APPLICATION

This application claims priority to Korean Patent Application No. 10-2010-0024412, filed Mar. 18, 2010, the disclosure of which is hereby incorporated herein by reference.

FIELD

The present invention relates to integrated circuit devices and, more particularly, to thermal image sensors and related devices.

BACKGROUND

Thermal sensors usually use the change in resistance which occurs when temperature increases with absorbed infrared rays. Thermal sensors require complicated manufacturing processes and high manufacturing costs since temperature coefficient of resistance (TCR) of the material of the thermal image sensors is less than 2 to 3% and a microelectromechanical system (MEMS) structure and high-vacuum packaging are typically needed to obtain necessary sensitivity. Moreover, since the characteristics of the material are fixed, it is difficult to achieve an optimal design for the material according to application of, for example, the range of operating temperature.

SUMMARY

Integrated circuit devices according to embodiments of the invention include thermal image sensors that utilize quantum dots therein to provide, among other things, variable resistance characteristics to at least portions of the sensors. According to some of these embodiments of the invention, a thermal image sensor includes a sensing unit configured to absorb radiation incident on a first surface thereof and first and second electrodes electrically coupled to the sensing unit. The sensing unit includes a plurality of quantum dots therein, which may extend between the first and second electrodes. These quantum dots may be configured to impart a negative resistance characteristic to the sensing unit. In particular, the sensing unit may include a sensing layer having first and second opposing ends, which are electrically coupled to the first and second electrodes, respectively, and the plurality of quantum dots may be distributed within the sensing layer.

According to additional embodiments of the invention, the sensing layer may include a material selected from a group consisting of amorphous silicon (a-Si) and vanadium oxide (VOx). In particular, the sensing layer may include amorphous silicon and the plurality of quantum dots may be formed of a semiconductor material having a smaller bandgap relative to amorphous silicon. Alternatively, the sensing layer may be a vanadium oxide layer and the plurality of quantum dots may include a metal selected from a group consisting of gold, platinum, copper, chromium and aluminum. Moreover, the plurality of quantum dots may be distributed within the sensing layer and may operate to reduce a resistivity of the sensing layer in response to increases in infrared radiation received at the first surface.

According to still further embodiments of the invention, the thermal image sensor may include a read-out integrated circuit (ROIC) electrically coupled to the sensing unit. In addition, at least one support may be provided, which is configured to support the sensing unit above a surface of the read-out integrated circuit. A reflective layer may also be provided on the surface of the read-out integrated circuit. This reflective layer is configured to redirect infrared radiation received thereon towards a second surface of the sensing unit, which may extend opposite the first surface.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Figure 1A:
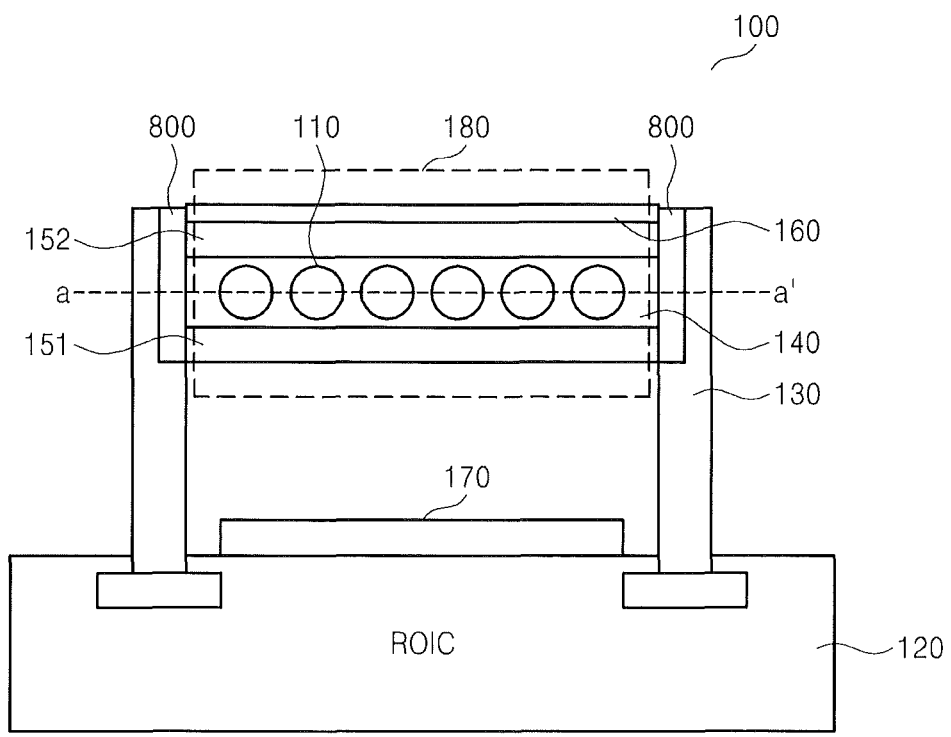
FIG. 1A is a diagram of an electronic device according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1B:
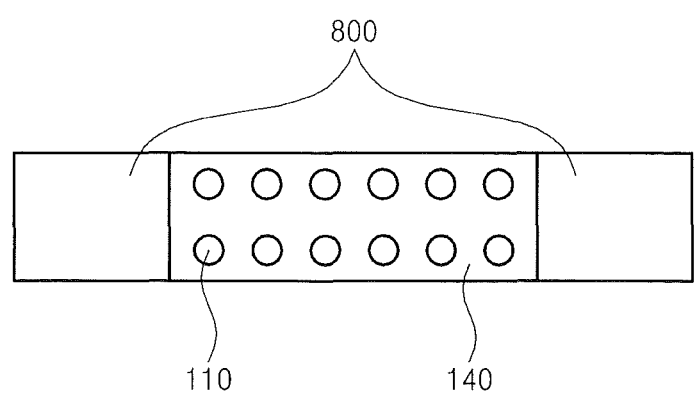
FIG. 1B is a sectional view of the electronic device illustrated in FIG. 1A.

FIGS. 1A and 1B are diagrams of an electronic device according to some embodiments of the present invention. The electronic device may be a thermal image sensor such as a pyroelectric infrared sensor, a bolometer infrared sensor, or a thermocouple infrared sensor. FIG. 1A shows a bolometer unit cell 100 as an example of the electronic device and FIG. 1B is a sectional view of the electronic device illustrated in FIG. 1A, taken along the line a-a' according to some embodiments of the present invention.

Referring to FIGS. 1A and 1B, the bolometer unit cell 100 includes a readout integrated circuit (ROIC) 120, a support 130, a pair of electrodes 800, and a sensing unit 180. The ROIC 120 includes a reflective layer 170 on the top and is connected to the sensing unit 180 by the support 130. The support 130 may be conductive. The ROIC 120 may be formed of silicon (Si), silicon oxide, silicon nitride, or metal oxide such as $AlO_x$ or $TiO_x$.

The sensing unit 180 is supported by the support 130 to be separated (or suspended) by a predetermined air gap from the reflective layer 170 in order to maximize the absorption of incident rays (e.g., infrared rays) and is also positioned between the two electrodes 800. The sensing unit 180 includes a sensing layer 140, a first structure layer 151, a second structure layer 152, and an absorption layer 160. The first structure layer 151, the sensing layer 140, the second structure layer 152, and the absorption layer 160 may be sequentially formed from the bottom to the top.

The absorption layer 160 absorbs incident rays (e.g., infrared rays). The sensing layer 140 senses resistance change and temperature change using the incident rays. The sensing layer 140 may be formed of amorphous silicon (a-Si) or $VO_x$, but the present invention is not restricted thereto. The sensing layer 140 is embedded with at least one quantum dot 110 and senses resistance change and temperature change using the characteristics of the quantum dot 110. The material of the quantum dot 110 may include at least one among metals such as Au, Pt, Cu, Cr, and Al and narrow-bandgap semiconductor materials.

Figure 2:
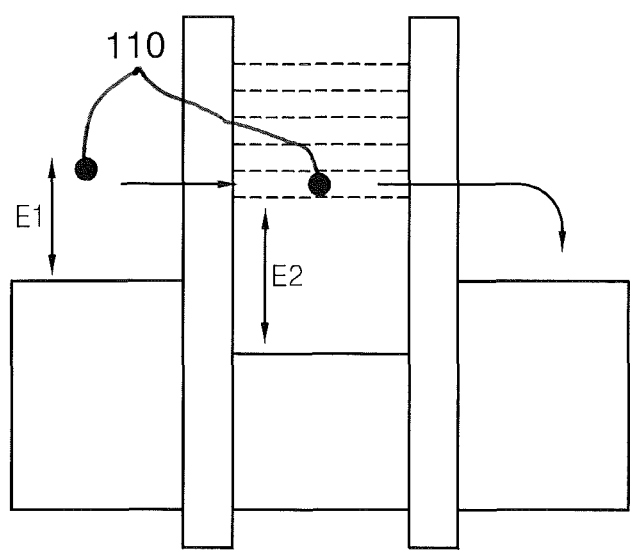
FIGS. 2 and 3 are diagrams showing the coulomb blockade of a quantum dot and the conduction and the resistance change with respect to temperature.
Figure 3:
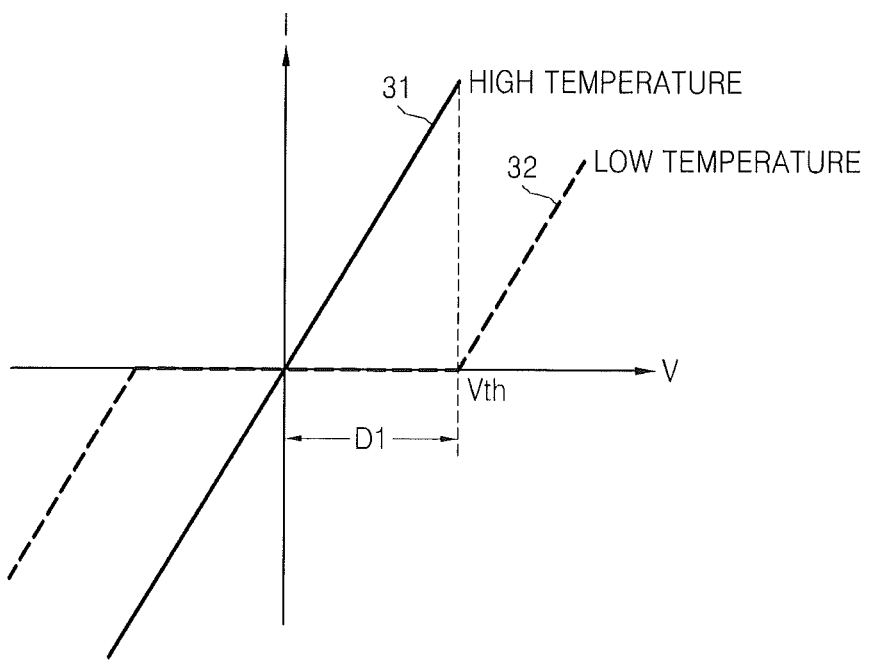

FIGS. 2 and 3 are diagrams illustrating the characteristics of the quantum dot 110 according to some embodiments of the present invention. FIG. 2 is a diagram showing the coulomb blockade of the quantum dot 110 and the conduction with respect to temperature.

Referring to FIG. 2, in order to transmit a carrier through the quantum dot 110, a coulomb blockade, i.e., energy E2 that can charge the quantum dot 110 is needed. The energy E2 is expressed by Equation (1):

$$E2 = \frac{e^2}{2C} \quad (1)$$

where C is a capacitance of the quantum dot 110 and "e" is the quantity of electric charge.

Also, all particles including the quantum dot 110 have energy E1 with respect to temperature. The energy E1 is expressed by Equation (2):

$$E1 = \frac{3}{2}kT \quad (2)$$

where "k" is a Boltzmann constant and T is a transition temperature (or absolute temperature).

When the carrier is thermally excited by temperature and reaches at least a certain temperature, the energy E1 may become higher than the energy E2 (see the arrows in FIG. 2) and a nonconductor may transition to a conductor. As a result, resistance may be changed.

FIG. 3 is a graph showing the resistance change with respect to temperature. Referring to FIG. 3, the energy E1 is higher than the energy E2 at high temperature and the graph 31 is obtained. The energy E1 is higher than the energy E2 only when at least certain voltage (e.g., a threshold voltage Vth) is applied at low temperature and the graph 32 is obtained. Since the graphs 31 and 32 have different shapes with respect to temperature in a first section D1, the first section D1 (e.g., resistance change in the first section D1) may be used for a thermal image sensor.

Figure 4:
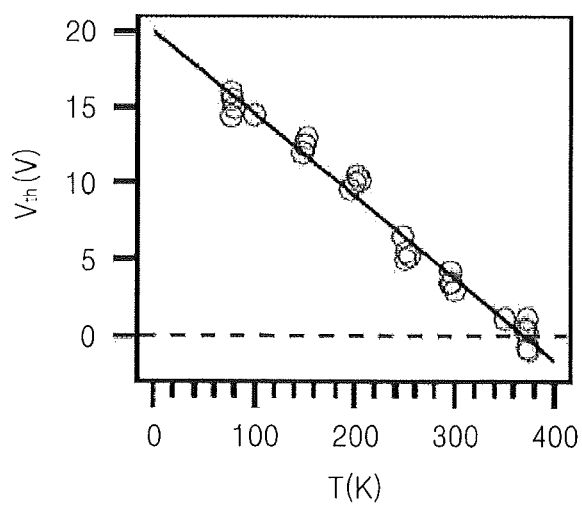
FIG. 4 is a graph of threshold voltage versus temperature.

FIG. 4 is a graph of threshold voltage versus temperature. Referring to FIG. 4, the threshold voltage Vth decreases as temperature increases. Especially, the threshold voltage Vth nearly converges to zero at a temperature of 370 K on the temperature axis, which may show a similar characteristic to the graph 31 illustrated in FIG. 3. In other words, it can be inferred that a nonconductor transitions to a conductor without a certain voltage.

Figure 5:
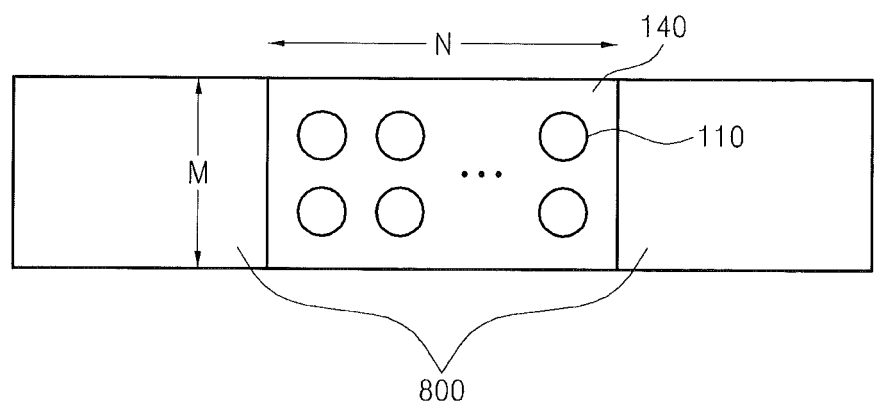
FIG. 5 is a diagram of a sensing layer including at least one quantum dot and an electrode connected to the sensing layer.
Figure 6:
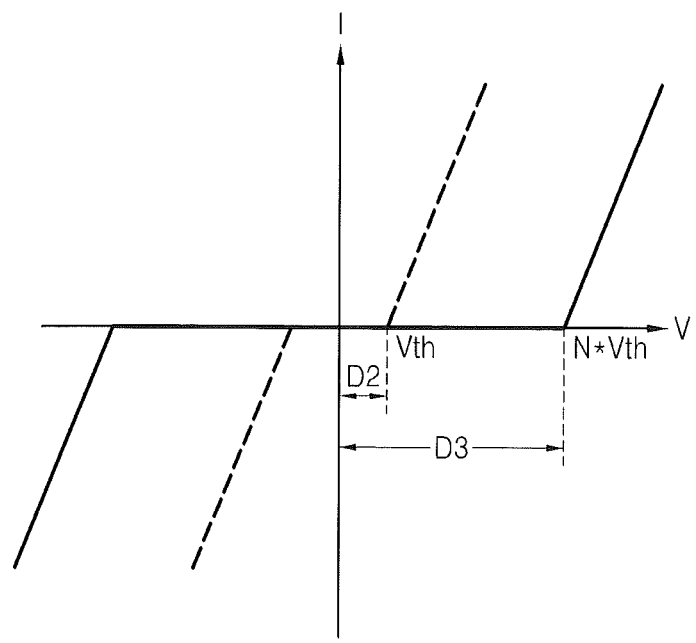
FIG. 6 is a graph showing the change in a threshold voltage when the number of quantum dots is changed.

FIGS. 5 and 6 are diagrams showing that the range of the first section D1 illustrated in FIG. 3 is changed depending on the number "N" of quantum dots according to some embodiments of the present invention. In detail, FIG. 5 is a diagram of the sensing layer 140 including at least one quantum dot 110 and a pair of the electrodes 800 connected to the sensing layer 140. FIG. 6 is a graph showing the change in the threshold voltage Vth when the number of the at least one quantum dot 110 is changed.

Referring to FIGS. 5 and 6, the sensing layer 140 is positioned between the two electrodes 800. The range of the first section D1 illustrated in FIG. 3 may be changed by changing the number "N" of the at least one quantum dot 110. For instance, when the number "N" of quantum dots 110 is increased, the threshold voltage Vth is changed so that a second section D2 is enlarged to a third section D3, as shown in FIG. 6. As a result, the threshold voltage Vth can be changed by changing the number of quantum dots 110.

As the number of the at least one quantum dot 110 increases, the threshold voltage Vth also increases, resulting in the increase of the transition temperature. As the threshold voltage Vth increases, a nonconductor transitions to a conductor. In other words, as the number of the at least one quantum dot 110 increases, a nonconductor transitions to a conductor.

The quantum dots 110 may be arranged in an N×M matrix where N and M are integers. Although the embodiments illustrated in FIG. 5 shows that the change from the threshold voltage Vth to N times the threshold voltage Vth (i.e., N*Vth) by the integer N leads to the change from the second section D2 to the third section D3 (or the change from the second section D2 to the third section D3 is influenced by N), the present invention is not restricted to these embodiments. For instance, the change from the second section D2 to the third section D3 may be influenced by M or both N and M.

Figure 7:
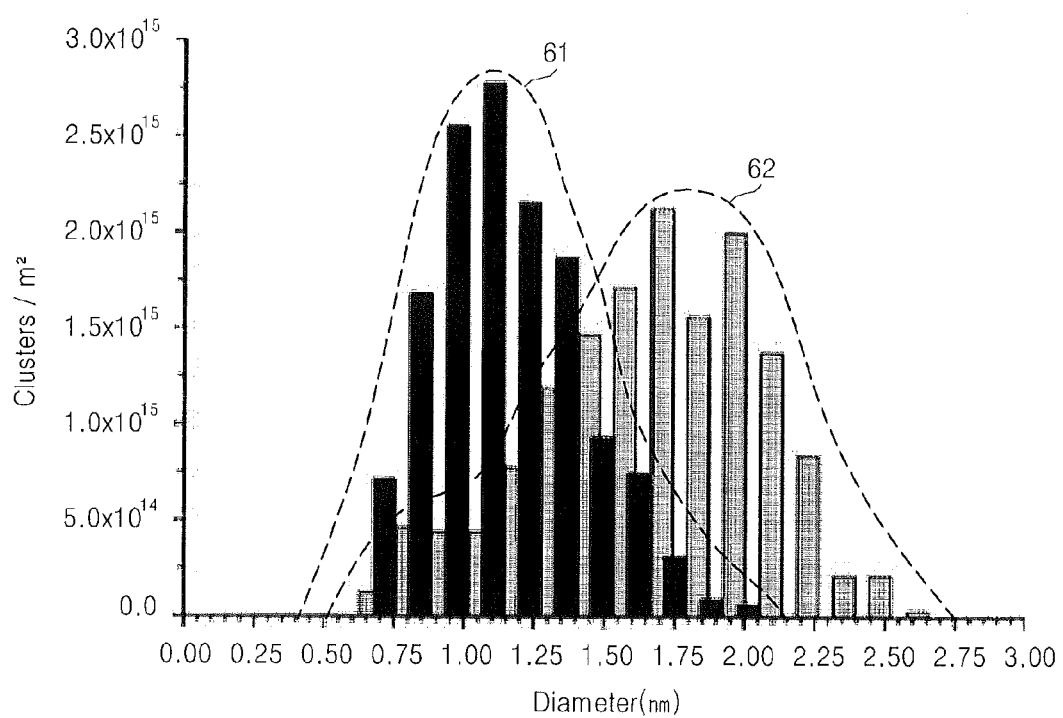
FIG. 7 is a graph showing two size distributions of quantum dots.
Figure 8:
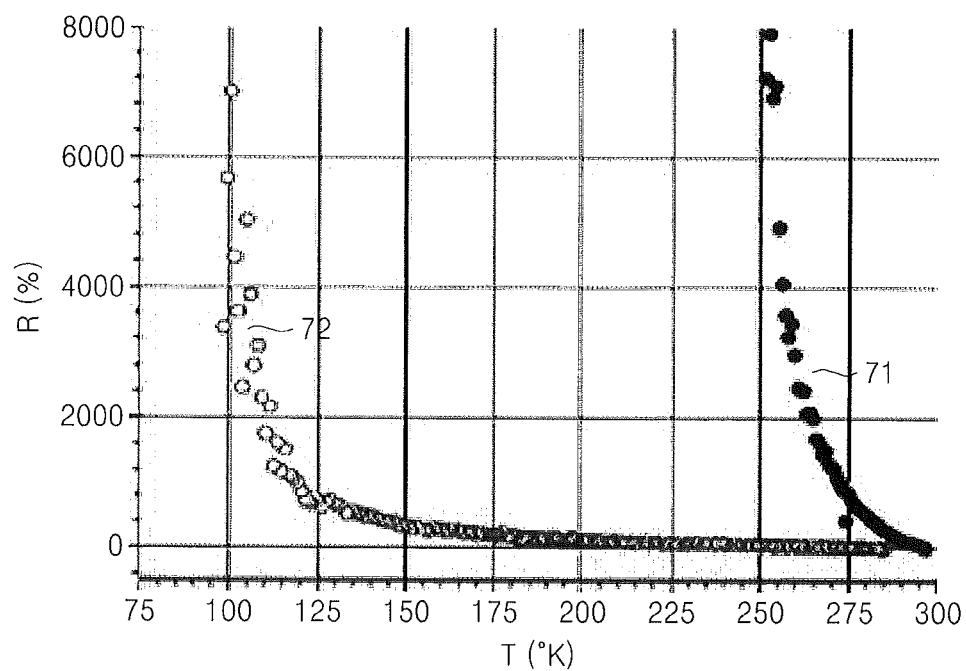
FIG. 8 is a graph of resistance versus temperature with respect to the two size distributions illustrated in FIG. 7.

FIGS. 7 and 8 are diagrams showing that temperature-resistance characteristics changes depending on the size of a quantum dot according to some embodiments of the present invention. FIG. 7 is a graph showing two size distributions 61 and 62 of quantum dots. FIG. 8 is a graph of resistance versus temperature with respect to the two size distributions 61 and 62 illustrated in FIG. 7.

Referring to FIGS. 7 and 8, the second size distribution 62 is larger than the first size distribution 61 and corresponds to a second temperature-resistance graph 72. The first size distribution 61 corresponds to a first temperature-resistance graph 71. The quantum dots in the second size distribution 62 have an average diameter of 1.56 nm and the quantum dots in the first size distribution 61 have an average diameter of 1.22 nm.

When the average diameter decreases from 1.56 nm to 1.22 nm, that is, when the second temperature-resistance graph 72 changes into to the first temperature-resistance graph 71, it is seen in FIG. 8 that the transition temperature at which a nonconductor transitions to a conductor increases from 125 K to 300 K. Since the capacitance of the quantum dot 110 decrease as the average size of the quantum dot 110 decreases, the energy E2 is increased according to Equation (1), which makes the transition from a nonconductor to a conductor more difficult.

In addition, when the average diameter decreases from 1.56 nm to 1.22 nm, that is, when the second temperature-resistance graph 72 changes into to the first temperature-resistance graph 71, a high temperature coefficient of resistance (TCR) of at least 100%/° K can be obtained since a resistance change of at least 5000% occurs at a temperature change of 50° K. In other words, the TCR can be changed depending on the size of the quantum dot 110.

Figure 9A:
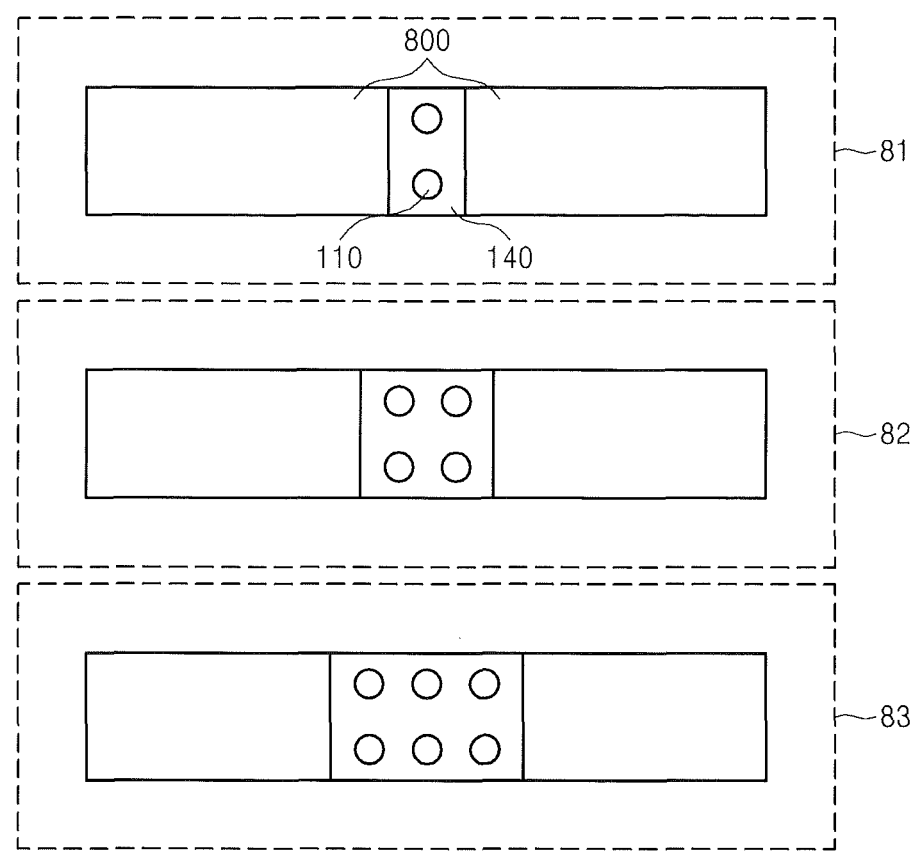
FIGS. 9A and 9B are sectional views of a thermal image sensor according to some embodiments of the present invention.
Figure 9B:
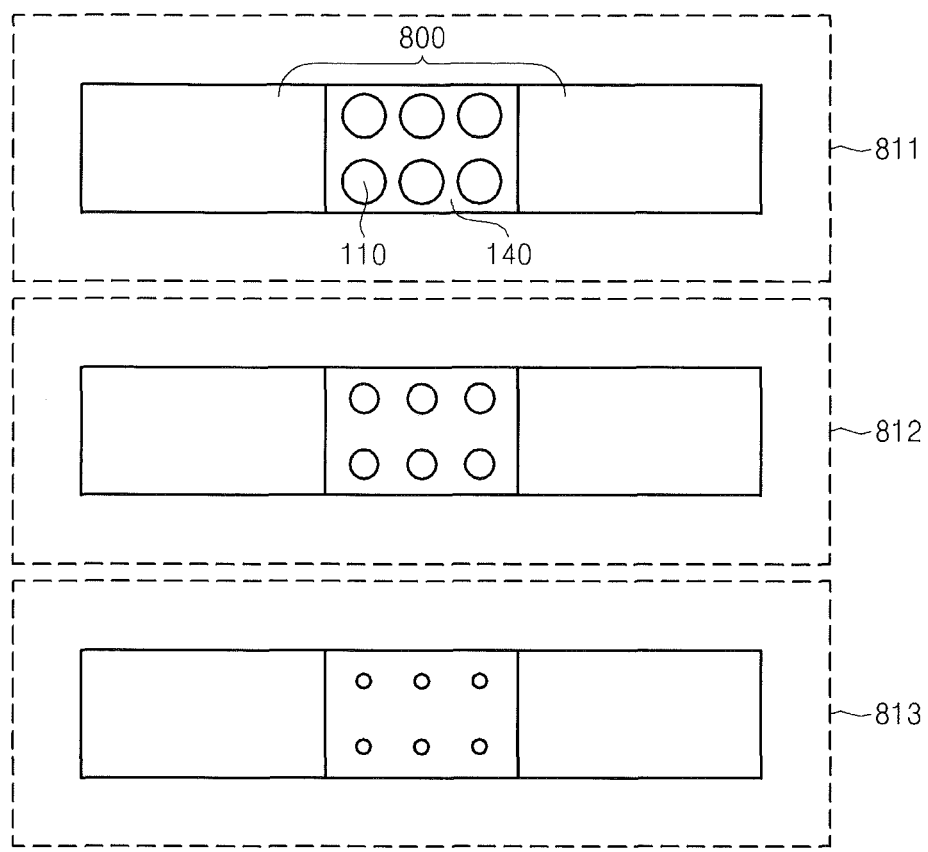

FIGS. 9A and 9B are sectional views of a thermal image sensor according to some additional embodiments of the present invention. The thermal image sensor may include at least one bolometer unit cell 100 illustrated in FIG. 1A or may have a similar structure to that of the bolometer unit cell 100 illustrated in FIG. 1A.

The thermal image sensor may include a substrate (e.g., the ROIC 120 illustrated in FIG. 1A), the support 130, a plurality of sensing layers 140, a plurality of pairs of electrodes 800. The plurality of the sensing layers 140 and the plurality of pairs of the electrodes 800 may share the ROIC 120 or the support 130 with one another or have separate ROICs or supports.

Figure 10:
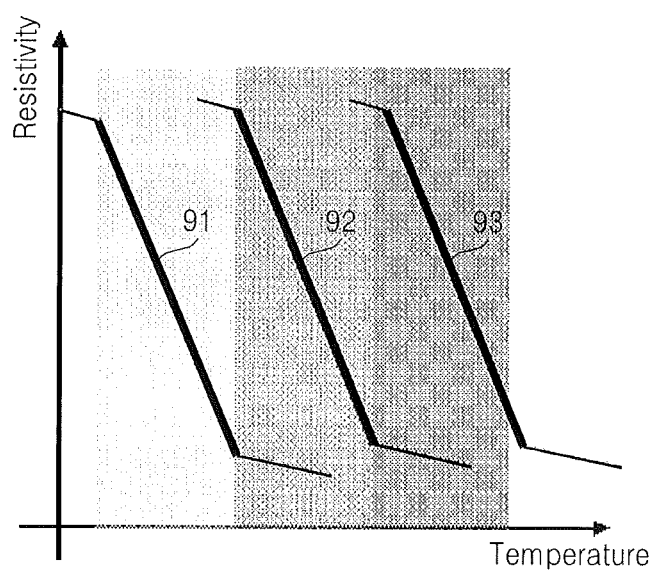
FIG. 10 is a graph showing the change in temperature-resistivity characteristic with respect to a gap between electrodes illustrated in FIG. 9A.

The vertical sectional view of the thermal image sensor may be the same as the diagram shown in FIG. 1A. The horizontal sectional view of the thermal image sensor (e.g., the sectional view of the bolometer unit cell 100 horizontally taken long the line a-a'), may be like as shown in FIG. 9A or 9B. FIG. 10 is a graph of showing the change in temperature-resistivity characteristic with respect to a gap between electrodes 800 illustrated in FIG. 9A.

Referring to FIG. 9A, reference numerals 81, 82, 83 denote the different structures of a thermal image sensor including the sensing layer 140 including the at least one quantum dot 110 and a pair of the electrodes 800 connected to the sensing layer 140. When the structure changes from 81 to 82 and 83, the gap between the electrodes 800 increases. At this time, the gap between the electrodes 800 may increase or decrease as the number of the at least one quantum dot 110 increases or decreases, but the present invention is not restricted thereto. For instance, even when the number of the at least one quantum dot 110 is fixed or decreases, the gap between the electrodes 800 may increase.

Like a case where the number of the at least one quantum dot 110 increases, when the gap between the electrodes 800 increases, the threshold voltage Vth also increases; which increases the transition temperature. As the threshold voltage Vth increases, a nonconductor transitions to a conductor. In other words, as the gap between the electrodes 800 increases, a nonconductor transitions to a conductor.

The structures 81, 82, and 83 illustrated in FIG. 9A respectively correspond to temperature-resistivity graphs 91, 92, and 93 illustrated in FIG. 10. Referring to FIG. 10, as the temperature increases, the resistivity decreases. This exhibits a negative temperature coefficient (NTC) characteristic of normal oxide semiconductor.

As described above, a temperature-resistivity graph can be changed depending on the gap between the electrodes 800. Accordingly, when an electronic device having the structures 81 through 83 having different gaps between the electrodes 800 is used to enable the transition to be made sequentially according to temperature, a thermal image sensor having high sensitivity in a wide range of temperature can be implemented.

Similarly, when an electronic device having structures 811, 812, and 813 illustrated in FIG. 9B, in each of which the sensing layer 140 includes a quantum dot 110 having a different size (e.g., a different average size) between two electrodes 800, is used to enable the transition to be made sequentially according to temperature, a thermal image sensor having high sensitivity in a wide range of temperature can be implemented. Consequently, the transition temperature can be adjusted by changing the number of the at least one quantum dot 110, the gap between two electrodes 800, or the size of the at least one quantum dot 110.

With the above-described characteristics, the present invention can be widely used for applications needing temperature sensing and adjustment. For instance, the present invention can be used for uncooled thermal image sensor and durable goods used in refrigerators, air conditioners, and automobiles and for the control of temperature of buildings. In addition, the present invention can be used in controlling temperature in the field of industry such as process control.

Figure 11:
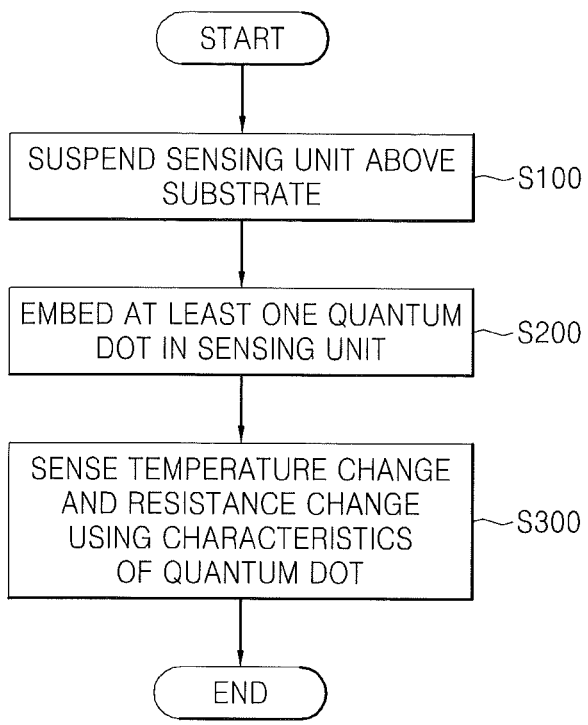
FIG. 11 is a flowchart of a sensing method of a thermal image sensor according to some embodiments of the present invention.

FIG. 11 is a flowchart of a sensing method of a thermal image sensor according to some embodiments of the present invention. The sensing method may be performed by a thermal image sensor including the electronic device 100 illustrated in FIG. 1A. Referring to FIG. 11, a sensing unit is suspended above a substrate in operation S100. At this time, the substrate may be the ROIC 120, which may be formed of silicon, silicon oxide, silicon nitride, or metal oxide such as $AlO_x$ or $TiO_x$. At least one quantum dot is embedded in the sensing unit in operation S200. At this time, the material of the quantum dot may include at least one among metals such as Au, Pt, Cu, Cr, and Al and narrow-bandgap semiconductor materials. Thereafter, when rays (e.g., infrared rays) are received, temperature change and resistance change are sensed using the characteristics of the quantum dot in operation S300. At this time, one of the characteristics of the quantum dot is that the quantum dot transitions from a nonconductor into a conductor when the energy of the quantum dot is higher than the energy of a coulomb blockade at a certain or higher temperature.

As described above, according to some embodiments of the present invention, an electronic device and a thermal image sensor can be provided with wanted sensitivity without requiring complicated microelectromechanical system (MEMS) structure and high-vacuum packaging, so that manufacturing processes become simple and manufacturing cost is decreased. In addition, the electronic device and the thermal image sensor can have high TCR through the characteristics of a quantum dot.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A thermal image sensor, comprising:
a first sensing unit configured to absorb radiation incident on a first surface thereof, said first sensing unit having a first plurality of quantum dots therein;
first and second electrodes electrically coupled to said first sensing unit;
a second sensing unit coupled to the first sensing unit and configured to absorb radiation incident on a first surface thereof, said second sensing unit having a second plurality of quantum dots therein; and
third and fourth electrodes electrically coupled to said second sensing unit,
wherein the first sensing unit has a different negative resistance characteristic than the second sensing unit.

2. The sensor of claim 1, wherein the first plurality of quantum dots extend between said first and second electrodes, and wherein the first plurality of quantum dots are configured to impart a first negative resistance characteristic to said first sensing unit, and wherein the second plurality of quantum dots extend between said third and fourth electrodes, and wherein the second plurality of quantum dots are configured to impart a second negative resistance characteristic to said second sensing unit.

3. The sensor of claim 1, wherein said first sensing unit comprises a first sensing layer having first and second opposing ends electrically coupled to said first and second electrodes, respectively, and wherein the first plurality of quantum dots are distributed within the first sensing layer, and wherein said second sensing unit comprises a second sensing layer having third and fourth opposing ends electrically coupled to said third and fourth electrodes, respectively, and wherein the second plurality of quantum dots are distributed within the second sensing layer, and wherein a first distance gap between the first and second electrodes is different than a second distance gap between the third and fourth electrodes.

4. The sensor of claim 3, wherein at least one of the first and second sensing layers comprises a material selected from a group consisting of amorphous silicon and vanadium oxide.

5. The sensor of claim 3, wherein at least one of the first and second sensing layers comprises amorphous silicon and the respective plurality of quantum dots comprise a semiconductor material having a smaller bandgap relative to amorphous silicon.

6. The sensor of claim 3, wherein at least one of the first and second sensing layers comprises vanadium oxide and the respective plurality of quantum dots comprise a metal selected from a group consisting of gold, platinum, copper, chromium and aluminum.

7. The sensor of claim 2, wherein said first and second sensing units comprise first and second sensing layers respectively; and wherein the first and second plurality of quantum dots are distributed within each of the respective first and second sensing layers in respective first and second N×M matrixes to reduce a resistivity of the respective sensing layer in response to increases in infrared radiation received at the respective first surface, wherein N is a number of quantum dots in a first direction of the respective sensing layer and M is a number of quantum dots in a second direction of the respective sensing layer, and wherein at least one of N and M of the first N×M matrix is different than a respective at least one of N and M of the second N×M matrix.

8. The sensor of claim 7, further comprising:
a read-out integrated circuit electrically coupled to said first and second sensing units;
at least one support configured to support said first and second sensing units above a surface of said read-out integrated circuit; and
a reflective layer on the surface of said read-out integrated circuit, said reflective layer configured to redirect infrared radiation received thereon towards respective second surfaces of said first and second sensing units.

9. The sensor of claim 3, wherein each of the first and second sensing layers comprises a first semiconductor material and the respective plurality of quantum dots comprise a second semiconductor material having a smaller bandgap relative to the first semiconductor material.

10. The sensor of claim 2, wherein said first sensing unit comprises a first semiconductor material and the first plurality of quantum dots comprise a second semiconductor material having a smaller bandgap relative to the first semiconductor material, and wherein said second sensing unit comprises the first semiconductor material and the second plurality of quantum dots comprise the second semiconductor material having a smaller bandgap relative to the first semiconductor material, and wherein an average quantum dot size of the first plurality of quantum dots is different than an average quantum dot size of the second plurality of quantum dots.

11. An electronic device comprising:
a substrate; and
at least two sensing units suspended above the substrate to sense resistance change occurring when infrared rays are absorbed,
wherein each of the at least two sensing units comprises at least one embedded quantum dot and senses the resistance change using the at least one quantum dot, wherein ones of the at least two sensing units are configured to have a different threshold voltage such that a combined range of temperature sensitivity of the at least two sensing units is greater than a range of temperature sensitivity of a single one of the at least two sensing units.

12. The electronic device of claim 11, wherein the at least two sensing units are configured to senses resistance change occurring when energy of the respective at least one quantum dot is higher than energy of a coulomb blockade.

13. The electronic device of claim 12, wherein ones of the at least two sensing units are configured to change a respective threshold voltage or a respective transition temperature with a changing number of the respective at least one quantum dot and sense resistance change occurring due to a change in the energy of the respective at least one quantum dot which occurs when the respective threshold voltage or the respective transition temperature is changed.

14. The electronic device of claim 12, wherein ones of the at least two sensing units are configured to change a respective transition temperature with a change of a size of the respective at least one quantum dot and sense resistance change occurring due to a change in the energy of the respective at least one quantum dot which occurs when the respective transition temperature is changed.

15. The electronic device of claim 12, further comprising a pair of electrodes connected to ones of the at least two sensing units, wherein the ones of the at least two sensing units are positioned between the respective pair of electrodes.

16. The electronic device of claim 15, wherein ones of the at least two sensing units are configured to change a respective threshold voltage or a respective transition temperature with a change in a respective distance gap between the respective pair of electrodes and sense resistance change occurring due to a change in the energy of the respective at least one quantum dot which occurs when the respective threshold voltage or the respective transition temperature is changed.

17. A thermal image sensor comprising:
a substrate;
at least two sensing units each suspended above the substrate and embedded with at least one quantum dot to sense resistance change, which occurs when infrared rays are absorbed, using the at least one quantum dot; and
at least two pairs of electrodes respectively connected to the at least two sensing units,
wherein each of the at least two sensing units is positioned between the corresponding two electrodes, and wherein the at least two pairs of electrodes have different distance gaps between two electrodes,
wherein the at least two sensing units have different threshold voltages.

18. The thermal image sensor of claim 17, wherein an average size of the at least one quantum dot embedded in one of the at least two sensing units is different from an average size of the at least one quantum dot embedded in another one of the at least two sensing units.

19. The thermal image sensor of claim 17, wherein the at least two sensing units have different temperature sensitivity ranges.

* * * * *